United States Patent
Kim et al.

(10) Patent No.: US 9,496,856 B2
(45) Date of Patent: Nov. 15, 2016

(54) APPARATUS AND METHOD FOR GENERATING RAMP SIGNAL

(71) Applicant: KOREA UNIVERSITY RESEARCH AND BUSINESS FOUNDATION, Seoul (KR)

(72) Inventors: Chul Woo Kim, Seoul (KR); Min Seob Shim, Seoul (KR); Jun Won Jung, Seoul (KR); Jung Moon Kim, Seoul (KR); Jun Young Maeng, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 14/688,483

(22) Filed: Apr. 16, 2015

(65) Prior Publication Data
US 2016/0079963 A1 Mar. 17, 2016

(30) Foreign Application Priority Data
Sep. 15, 2014 (KR) ........................ 10-2014-0122306

(51) Int. Cl.
*H03K 3/12* (2006.01)
*H03K 4/502* (2006.01)
*H03K 3/03* (2006.01)

(52) U.S. Cl.
CPC ............ *H03K 4/502* (2013.01); *H03K 3/0322* (2013.01); *H03K 3/12* (2013.01)

(58) Field of Classification Search
CPC .......... H03K 3/12; H03K 3/012; H03K 4/06; H03K 4/08; H03K 4/12; H03K 4/063; H03K 4/502
USPC .................................................. 327/131, 132
See application file for complete search history.

(56) References Cited

U.S. PATENT DOCUMENTS 6,946,917 B2 * 9/2005 Raha .................. H03K 5/12
331/16

OTHER PUBLICATIONS

Minseob Shim et al. "Self-Powered 30μW-to-10mW Piezoelectric Energy-Harvesting System with 9.09ms/V Maximum Power Point Tracking Time" 2014 IEEE International Solid-State Circuits Conference. Session 23.7, pp. 406-408 (Feb. 9, 2014).

* cited by examiner

*Primary Examiner* — John Poos
(74) *Attorney, Agent, or Firm* — Novick, Kim & Lee, PLLC; Sang Ho Lee

(57) ABSTRACT

Provided is a ramp signal generating apparatus. The ramp signal generating apparatus includes N (N is a natural number) ramp signal generating cells that are connected in series to each other. Each of the ramp signal generating cells includes a power voltage unit for supplying current source, a latch unit for latching an output voltage of the power voltage unit, and a switch unit for outputting the voltage latched by the latch unit as an output voltage in response to an input signal.

5 Claims, 4 Drawing Sheets

APPARATUS AND METHOD FOR GENERATING RAMP SIGNAL

STATEMENT REGARDING PRIOR DISCLOSURES

A prior disclosure was made by joint inventors on Feb. 9, 2014, in a printed publication, which does not qualify as prior art under AIA 35 U.S.C. 102(b)(1)(A). A copy of the disclosure publication is submitted herewith in an Information Disclosure Statement.

CROSS-REFERENCE TO RELATED PATENT APPLICATION

This application claims the benefit of Korean Patent Application No. 10-2014-0122306, filed on Sep. 15, 2014, in the Korean Intellectual Property Office, the disclosure of which is incorporated herein in its entirety by reference.

BACKGROUND OF THE INVENTION

1. Field of the Invention

The present invention relates to a ramp signal generating apparatus and method, and more particularly, to a ramp signal generating apparatus and method having a constant frequency despite change in applied VDD voltage while operating with low power.

2. Description of the Related Art

In general, a ramp signal generating apparatus has been widely used to generate a ramp signal for control of an operation of a main analog integrated circuit such as a DC-DC converter, an energy harvesting circuit, or the like.

Such a conventional ramp signal generating apparatus needs a plurality of comparers and digital circuits and needs two reference voltages or more for adjustment of amplitude of a ramp signal. Accordingly, the conventional ramp signal generating apparatus is disadvantageous in terms of high power consumption for driving the ramp signal generating apparatus. In addition, the conventional ramp signal generating apparatus has characteristics whereby a frequency is easily varied when a voltage of used power is changed. Accordingly, an energy harvesting circuit or a DC-DC converter for receiving incomplete power and supplying stable power for a circuit operation has serious difficulty in using the conventional ramp signal generating apparatus.

Thus, currently, there is a need for a circuit having a very simple structure and low power consumption and for stably generating a ramp signal despite unstable power supply compared with the conventional ramp signal generating apparatus.

SUMMARY OF THE INVENTION

The present invention provides a ramp signal generating apparatus and method having a very simple structure and low power consumption.

The present invention provides a ramp signal generating apparatus and method for generating a constant ramp signal without changing a frequency despite change in VDD voltage.

According to an aspect of the present invention, there is provided a ramp signal generating apparatus including N (N is a natural number) ramp signal generating cells that are connected in series to each other, wherein each of the ramp signal generating cells includes a power voltage unit for supplying current source, a latch unit for latching an output voltage of the power voltage unit, and a switch unit for outputting the voltage latched by the latch unit as an output voltage in response to an input signal.

The ramp signal generating apparatus may output an output signal of an $N^{th}$ ramp signal generating cell as a ramp signal.

The power voltage unit may supply constant current as current source.

The latch unit may include switches that are connected via a cross-coupled method.

The switch unit may include at least one capacitor and controls charging and discharging of the at least one capacitor in response to the input signal.

According to another aspect of the present invention, there is provided a ramp signal generating method including generating constant current from a reference voltage generator for generating a constant reference voltage, latching a voltage generated according to the constant current, and outputting the latched voltage in response to an input signal.

The ramp signal generating method may further include charging a predetermined capacitor according to the latched voltage, and outputting the voltage when the charged voltage reaches a preset level.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
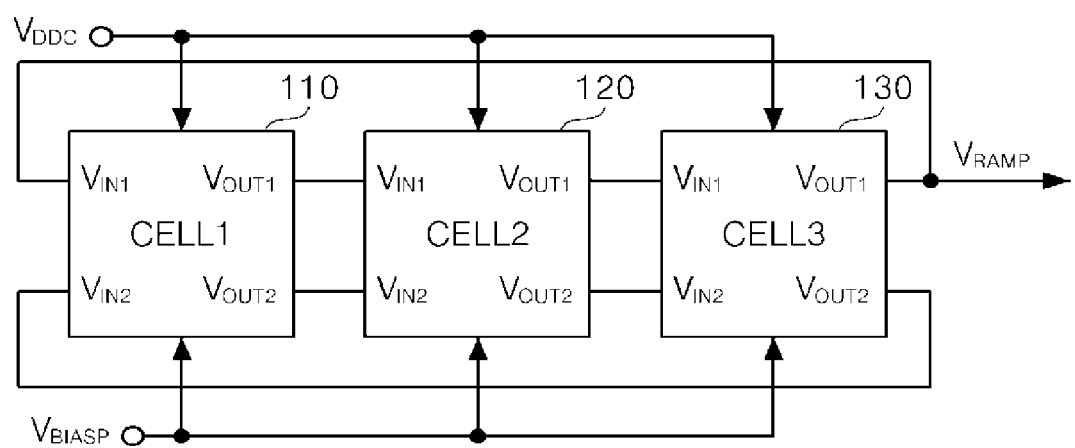
FIG. 1 is a schematic block diagram of a ramp signal generating apparatus according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the drawings, like reference numerals refer to like elements throughout.

The terms such as "first", "second", "A", "B", etc. are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the teachings of the present invention. As used herein, the term "and/or" includes any and all combinations of one or more of the associated listed items.

It will be understood that when an element, such as a layer, a region, or a substrate, is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" or "has" used herein specify the presence of stated features, integers, steps, operations, members, components, and/or groups thereof, but do not preclude the presence or addition of one or more other features, integers, steps, operations, members, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made in detail to the exemplary embodiments of the present invention with reference to the accompanying drawings. Throughout this specification and claims, when a certain part "includes", "comprises", or "has" a certain component, this indicates that the part may further include another component instead of excluding another component unless there is no different disclosure.

FIG. 1 is a schematic block diagram of a ramp signal generating apparatus 100 according to an embodiment of the present invention. Referring to FIG. 1, the ramp signal generating apparatus 100 according to an embodiment of the present invention includes three ramp signal generating cells CELL1 110, CELL2 120, and CELL3 130 that are aligned and connected to each other. In this case, the ramp signal generating apparatus 100 outputs an output signal of the lastly connected third ramp signal generating cell CELL3 130 as a ramp signal.

FIG. 1 illustrates an example of the ramp signal generating apparatus 100 including the three ramp signal generating cells CELL1 110, CELL2 120, and CELL3 130. However, the present invention is not limited to the example of FIG. 1. That is, the present invention relates to a structure in which a plurality of ramp signal generating cells are connected in series to each other and is not limited to the number of the ramp signal generating cells. Accordingly, the ramp signal generating apparatus 100 according to the present invention may include N (N is a natural number) ramp signal generating cells that are connected in series to each other. In this case, an output signal of an $N^{th}$ ramp signal generating cell may be a ramp signal.

Figure 2:
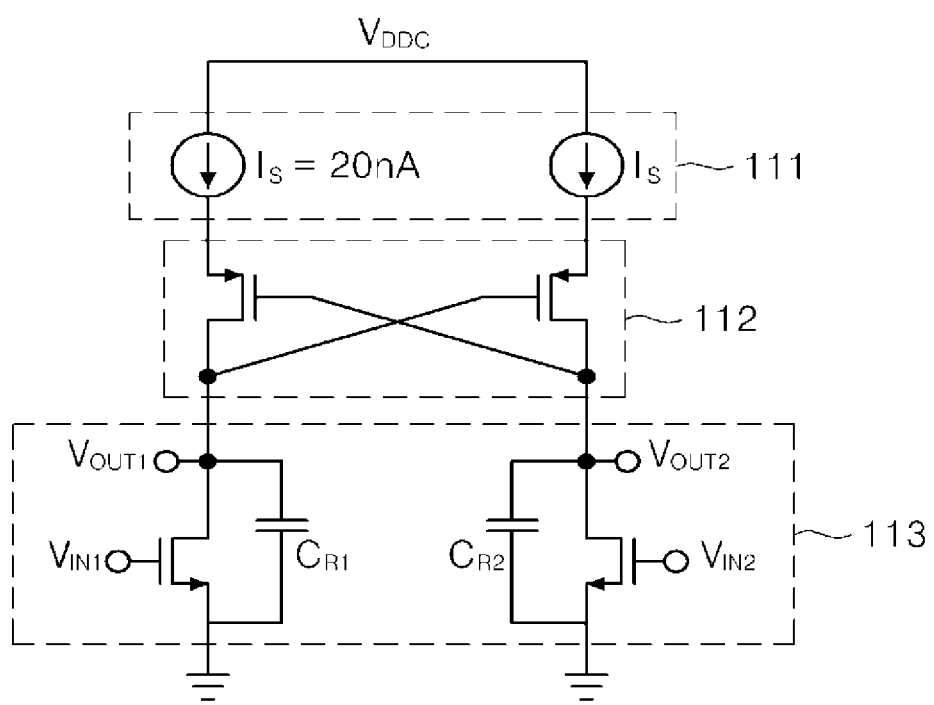
FIG. 2 is a circuit diagram of each of the cells included in the ramp signal generating apparatus of FIG. 1.

FIG. 2 is a circuit diagram of each of the cells included in the ramp signal generating apparatus 100 of FIG. 1. In this case, the cells have the same structure, and thus the structure of the ramp signal generating cell CELL1 110 is illustrates in the example of FIG. 2.

Referring to FIG. 2, the ramp signal generating cell CELL1 110 includes only six MOSFETs that operate as a power voltage unit 111, a latch unit 112, and a switch unit 113.

The power voltage unit 111 supplies current source Is for an operation of the ramp signal generating cell CELL1 110. In particular, the power voltage unit 111 supplies constant current (e.g. 20 nA) to the latch unit 112 in order to output a constant ramp signal irrespective a power voltage $V_{DD}$. To this end, the power voltage unit 111 may use a voltage reference or a beta multiplier for generating constant current despite change in the power voltage $V_{DD}$.

The latch unit 112 latches an output voltage of the power voltage unit 111. To this end, two MOSFETs included in the latch unit 112 are connected via a cross coupled method in order to more definitely separate voltage plots with opposite phases and to maintain an interval between ramp signals.

The switch unit 113 outputs the voltage latched by the latch unit 112 as output voltages $V_{OUT1}$ and $V_{OUT2}$ in response to input signals $V_{IN1}$ and $V_{IN2}$. In this case, the input signals $V_{IN1}$ and $V_{IN2}$ are output signals of ramp signal generating cells connected to a front end in the series-connected structure and the output voltages $V_{OUT1}$ and $V_{OUT2}$ are input signals of ramp signal generating cells connected to a rear end of the series-connected structure. When the corresponding ramp signal generating cell is a last cell of the series-connected structure, the output voltages $V_{OUT1}$ and $V_{OUT2}$ correspond to a ramp signal.

As illustrated in FIG. 2, when at least one capacitors $C_{R1}$ and $C_{R2}$ are connected to the switch unit 113, charging/discharging of the capacitors $C_{R1}$ and $C_{R2}$ may be controlled in response to the input signals $V_{IN1}$ and $V_{IN2}$.

Figure 3:
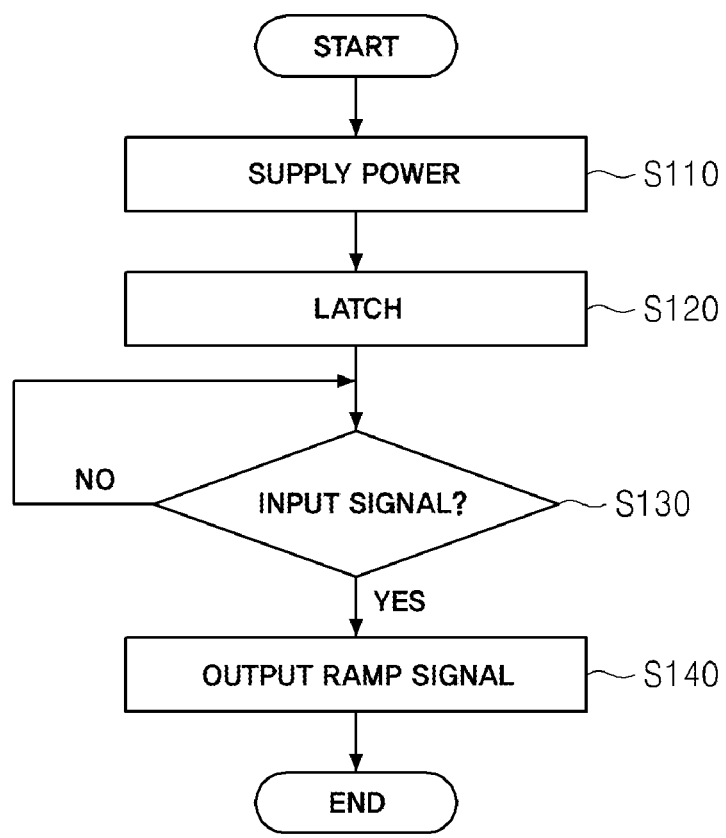
FIG. 3 is a flowchart of a ramp signal generating method according to an embodiment of the present invention.

FIG. 3 is a flowchart of a ramp signal generating method according to an embodiment of the present invention. With reference to FIGS. 2 and 3, the ramp signal generating method according to an embodiment of the present invention will now be described.

First, in operation S110, a power supplying unit 111 supplies a voltage to the latch unit 112. In this case, the power supplying unit 111 may supply a voltage generated according to constant current generated by a reference voltage generator for generating a constant reference voltage.

In operation S120, the latch unit 112 latches a voltage supplied from the power supplying unit 111.

In operation S140, the latched voltage is output in response to an input signal input in operation S130. In this case, a signal output in a last cell is a ramp signal.

As illustrated in FIG. 2, when predetermined capacitors $C_{R1}$ and $C_{R2}$ are connected to the switch unit 113, the method may further include charging the capacitors $C_{R1}$ and $C_{R2}$ according to the latched voltage and outputting the voltage when the charged voltage reaches a preset level. In this case, in operation S110, since constant current is supplied, charging time of the capacitors $C_{R1}$ and $C_{R2}$ is fixed, thereby reducing energy consumption.

Figure 4:
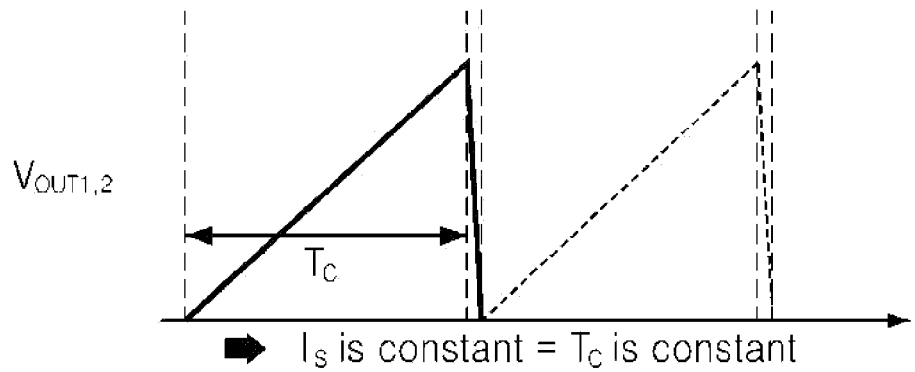
FIGS. 4 (*a*)-4(*c*) are diagrams for explanation of an effect of a ramp signal generating apparatus according to an embodiment of the present invention.
Figure 4:
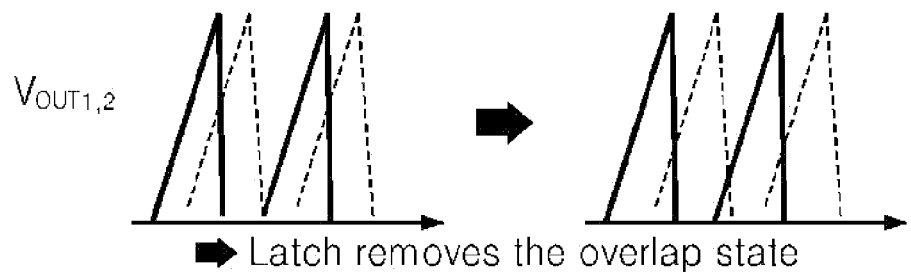
Figure 4:
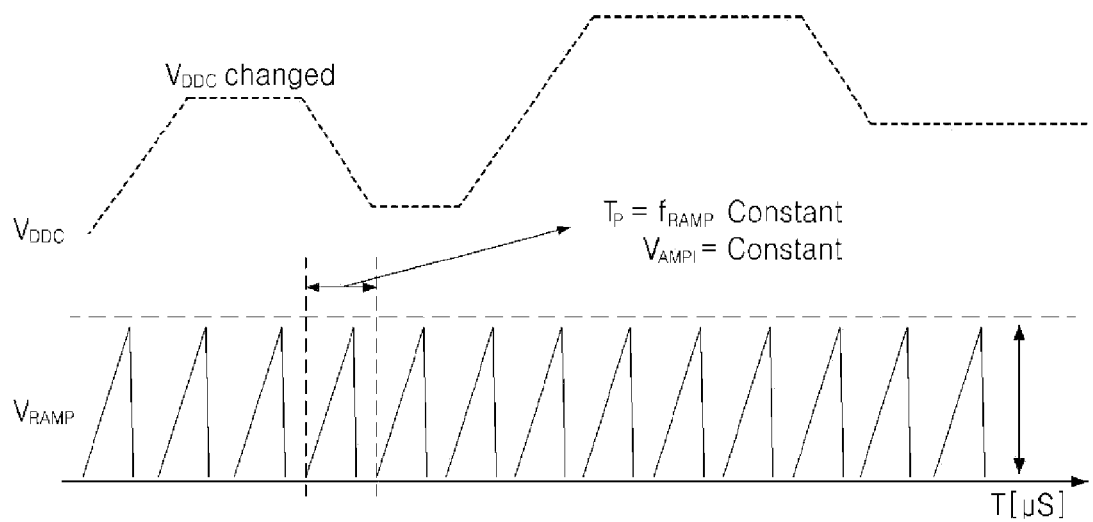

FIGS. 4 (a)-4 (c) are diagrams for explanation of an effect of a ramp signal generating apparatus according to an embodiment of the present invention. FIG. 4 (a) illustrates an example in which constant current Ic is supplied and thus a period Tc of output signals $V_{OUT1}$ and $V_{OUT2}$ is constant, FIG. 4 (b) illustrates an example in which overlap of output signals is removed by a latch, and FIG. 4 (c) illustrates an example in which a fixed ramp signal VRAMP is output irrespective of change in a power voltage $V_{DD}$.

According to the present invention, constant current is generated using a reference voltage generator for generating a constant reference voltage despite change in a VDD voltage and generates a ramp signal by charging a parasitic capacitor or a small capacitor of a MOSFET and then discharging with electric charges when the current reaches a predetermined voltage level. In this case, only low current of several tens of nanoamps is required and voltage amplitude is constant when a ramp signal of several hundreds of KHz is generated. In addition, current of current source is maintained by a reference voltage generator despite change in VDD voltage, and thus frequency is always constant. Due to this characteristic, the ramp signal generating apparatus according to the present invention is very appropriate for a DC-DC converter that requires a low power control circuit or an energy harvesting circuit with drastic change in VDD.

The embodiments of the present invention may be written as computer programs and can be implemented in general-use digital computers that execute the programs using a computer readable recording medium.

Examples of the computer readable recording medium include magnetic storage media (e.g., ROMs, floppy disks, hard disks, etc.) and optical recording media (e.g., CD-ROMs, or DVDs).

The present invention has been particularly shown and described with reference to exemplary embodiments thereof. It will be understood by those of ordinary skill in the art that various changes in form and details may be made therein without departing from the spirit and scope of the present invention as defined by the following claims.

What is claimed is:

1. A ramp signal generating apparatus comprising an N (N is a natural number) number of ramp signal generating cells that are connected in series to each other,
    each of the ramp signal generating cells comprising:
    a power voltage unit supplying a current source;
    a latch unit latching an output voltage of the power voltage unit; and
    a switch unit outputting the voltage latched by the latch unit as an output voltage of the switch unit in response to an input signal, wherein the ramp signal generating apparatus outputs an output signal of an $N^{th}$ ramp signal generating cell as a ramp signal.

2. The ramp signal generating apparatus according to claim 1, wherein the power voltage unit supplies a constant current as the current source.

3. The ramp signal generating apparatus according to claim 1, wherein the latch unit comprises a plurality of switches that are connected in a cross-coupled configuration.

4. The ramp signal generating apparatus according to claim 1, wherein the switch unit comprises at least one capacitor and controls charging and discharging of the at least one capacitor in response to the input signal.

5. A ramp signal generating method comprising:
    generating a constant current from a reference voltage generator, wherein the reference voltage generator generates a constant reference voltage;
    latching a voltage generated in response to the constant current; and
    outputting the latched voltage in response to an input signal;
    charging a predetermined capacitor according to the latched voltage; and
    outputting the charged voltage when the charged voltage reaches a preset level.

* * * * *